United States Patent
Gao

(10) Patent No.: US 11,612,081 B2
(45) Date of Patent: Mar. 21, 2023

(54) TWO PHASE CONTAINMENT SYSTEM HAVING CONTROLLED AIR FLOW

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

(*) Notice: Subject to any disclaimer, the term of this patent is extended or adjusted under 35 U.S.C. 154(b) by 0 days.

(21) Appl. No.: 17/409,657

(22) Filed: Aug. 23, 2021

(65) Prior Publication Data

US 2023/0057498 A1 Feb. 23, 2023

(51) Int. Cl.
*H05K 7/20* (2006.01)

(52) U.S. Cl.
CPC .......... *H05K 7/208* (2013.01); *H05K 7/203* (2013.01); *H05K 7/20136* (2013.01); *H05K 7/20209* (2013.01); *H05K 7/20318* (2013.01); *H05K 7/20327* (2013.01); *H05K 7/20381* (2013.01); *H05K 7/20718* (2013.01)

(58) Field of Classification Search
CPC .......... H05K 7/20136; H05K 7/20209; H05K 7/203; H05K 7/20318; H05K 7/20327; H05K 7/20381; H05K 7/20718; H05K 7/208

See application file for complete search history.

(56) References Cited

U.S. PATENT DOCUMENTS

| | | | | |
|---|---|---|---|---|
| 9,328,964 | B2* | 5/2016 | Shelnutt | H05K 7/20818 |
| 10,206,307 | B2* | 2/2019 | Lau | H05K 7/203 |
| 10,470,337 | B2* | 11/2019 | Uchida | F25D 9/00 |
| 11,076,508 | B2* | 7/2021 | Gao | H05K 7/20836 |
| 2021/0410320 | A1* | 12/2021 | Yang | H05K 7/20327 |

FOREIGN PATENT DOCUMENTS

GB      2511354 A  *  9/2014  ......... F28D 15/0233

* cited by examiner

*Primary Examiner* — Robert J Hoffberg
(74) *Attorney, Agent, or Firm* — Womble Bond Dickinson (US) LLP

(57) ABSTRACT

A two-phase immersion cooling system for cooling electronics. The electronics are immersed in immersion tank filled with phase change liquid. As liquid evaporates due to heat generated by the electronics, it enters a vapor passageway that leads the vapor to a condenser situated remotely from the immersion tank. Upon condensing at the condenser, the condensed liquid is directed to a resupply tank, wherein the condensed liquid cools. When the level of the two phase liquid in the immersion tank drops below a set threshold, a pump is activated to deliver the condensed liquid from the resupply tank to the immersion tank. The immersion tank, vapor passageway and condenser are position inside a containment passageway. The containment passageway captures any vapor not entering the vapor passageway and direct such vapor to the condenser. An air mover generates pressure differential within the containment passageway to direct the vapor towards the condenser.

20 Claims, 6 Drawing Sheets

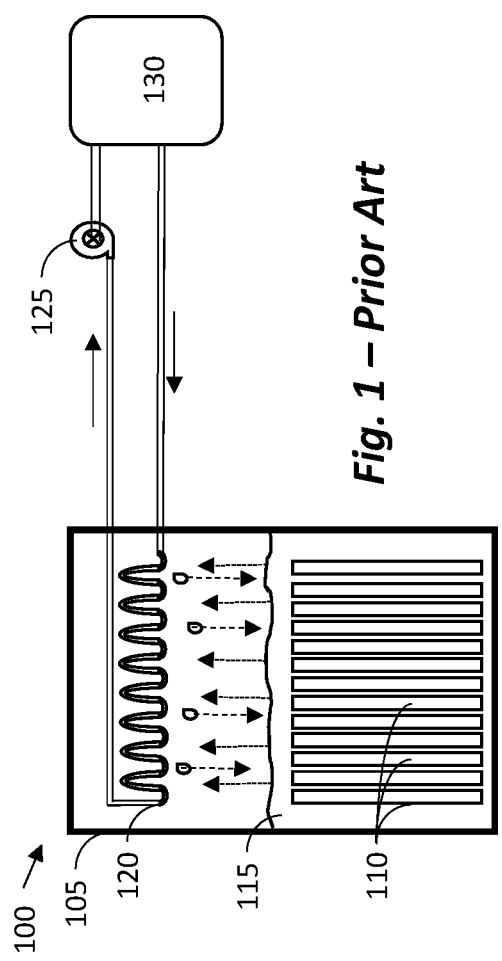
*Fig. 1 – Prior Art*
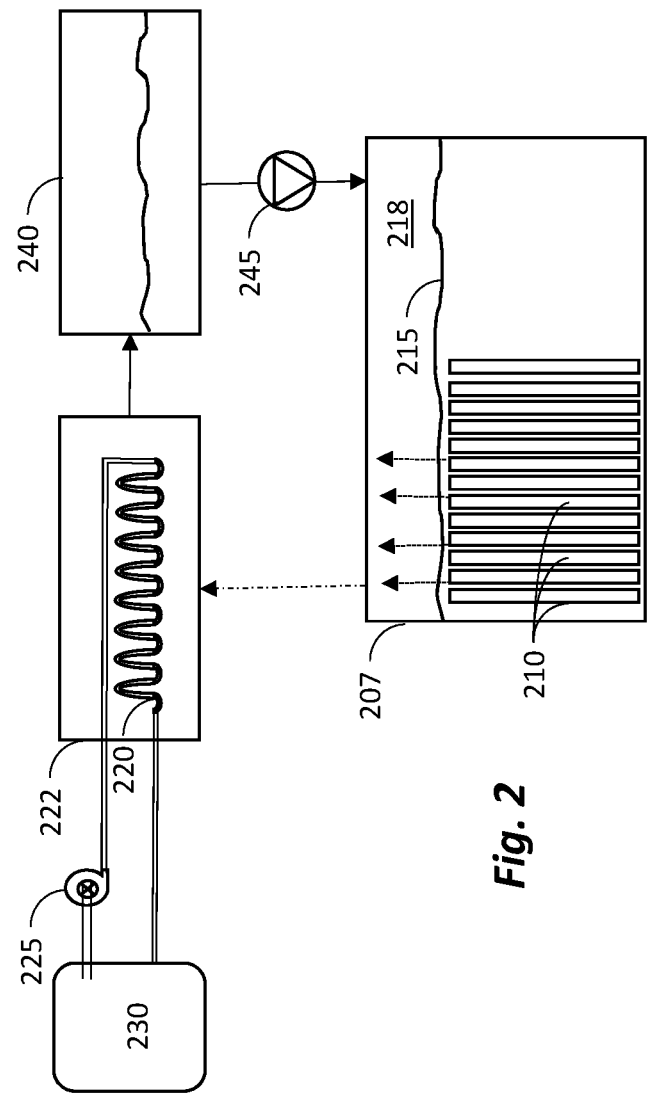
*Fig. 2*

US 11,612,081 B2

TWO PHASE CONTAINMENT SYSTEM HAVING CONTROLLED AIR FLOW

FIELD OF THE INVENTION

Embodiments of the present invention relate generally to enhanced and reliable cooling of advanced processors and electronics, specifically to improved two-phase immersion cooling for servers.

BACKGROUND

Cooling is a prominent factor in a computer system and data center design. The number of high performance electronic components, such as high performance processors packaged inside servers, has steadily increased, thereby increasing the amount of heat generated and dissipated during the ordinary operations of the servers. The proper operation of these processors is highly dependent on reliable removal of the heat they generate. Thus, proper cooling of the processors can provide high overall system reliability.

Electronics cooling is very important for computing hardware and other electronic devices, such as CPU servers, GPU servers, storage servers, networking equipment, edge and mobile system, on-vehicle computing box and so on. All these devices and computers are used for critical businesses and are the fundamentals of a company's daily business operations. The design of the hardware component and electronics packaging needs to improve to continuously support the performance requirements. Cooling of these electronic devices becomes more and more challenging to ensure that they function properly by constantly providing properly designed and reliable thermal environments.

Many advanced chips, and especially high power density chips, require liquid cooling. These chips are exceedingly expensive, so that every effort needs to be taken to ensure proper heat removal from these chips. A method for cooling, generally referred to as direct two-phase immersion cooling, has been introduced using two phase liquid. Two-phase immersion cooling is a relatively new type of cooling technology implemented currently for servers and data centers. In a two-phase immersion cooled system the electronic components are submerged directly in a bath of two phase heat transfer liquid. The two phase liquid is a specifically developed liquid which is nonconductive and non-corrosive, so that it may come in direct contact with the electronic devices without affecting the circuitry (e.g., shorting) or harming the devices. Additionally, the two phase liquid is a much better heat conductor than air, which means it is more capable for handling high power densities.

Another feature of the two phase liquid is that it has a relative low boiling point e.g., a low boiling point which can be similar or less than the designed operational temperatures of the electronic devices. Consequently, the two phase liquid boils when contacting the surface of heat generating devices, and the vapors rise naturally towards a condenser. Upon reaching the cold condenser the vapor condenses and releases the heat it removed from the electronic device upon vaporizing. The cyclical two-phase change between liquid and vapor efficiently and constantly removes heat generated by operating devices. The heat is constantly removed from the immersion container by the cooling fluid running through the vapor condenser. In such immersion cooling system, one benefit of the natural boiling and rising of the vapor is that it causes passive circulation, thus negating the need for pumps to circulate the two phase liquid.

While two-phase immersion cooling not only needs to provide the required thermal performance and reliability, since data centers may have thousands of chips requiring cooling, the cost of the cooling system and its maintenance must remain acceptable. But also since the two phase cooling liquid is generally proprietary and is very expensive, proper design and operation is needed for the overall solution cost. With the current design of two-phase immersion systems there may exist a significant loss of the two phase liquid in the form of escaping vapor, which drastically raises the cost of maintaining the system and may also lead to unacceptable temperature rise if the two phase liquid is not timely replenished.

BRIEF DESCRIPTION OF THE DRAWINGS

Embodiments of the invention are illustrated by way of example and not limitation in the figures of the accompanying drawings in which like references indicate similar elements.

FIG. 1 is a block diagram illustrating an example of a two-phase immersion system according to the prior art.

FIG. 2 is a schematic illustrating a two-phase immersion system according to an embodiment.

DETAILED DESCRIPTION

Figure 3:
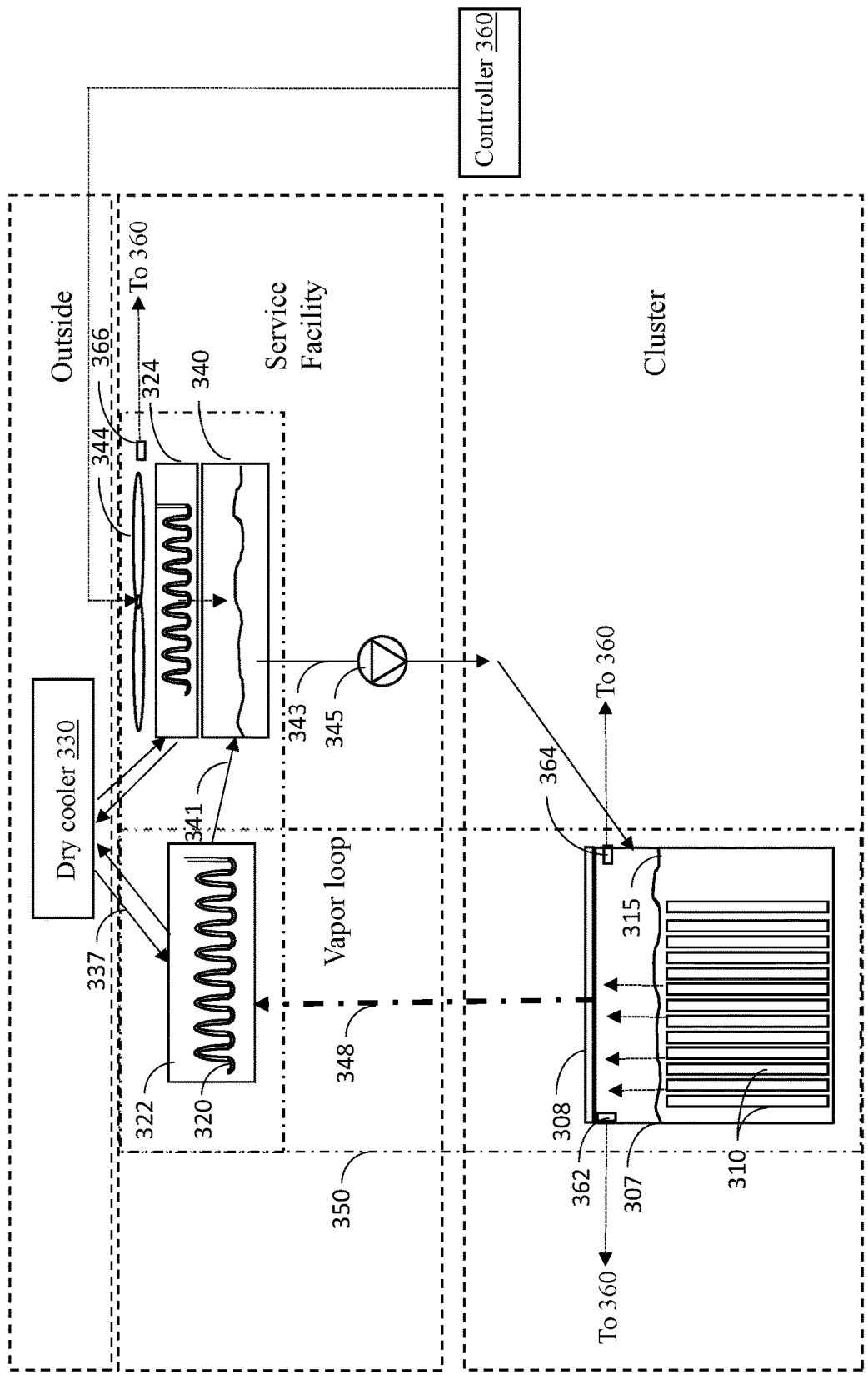
FIG. 3 illustrates an embodiment of a two-phase immersion system in a computing facility.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Incidentally, in the following embodiments similar elements are identified with similar reference numbers in the formal x ##, wherein the first digit x is replaced by the same digit as the figure number, while the next two digits ## are maintained consistent among the embodiments. Consequently, explanation of previously disclosed elements may not be repeated in subsequent embodiments.

FIG. 1 is a general diagram of a conventional two-phase immersion cooling system 100. The system includes a sealed enclosure 105 housing a plurality of servers 110 (generally in the form of exposed PCB boards), which are immersed in two phase liquid pool 115. As devices within servers 110 operate and generate heat, liquid contacting these devices evaporates and the vapor rises as shown by the dotted arrows. As the vapor rises it comes in contact with condenser 120 and condenses back to liquid form and returns down to the liquid pool 115, as illustrated by the dashed arrows. Meanwhile, the condenser 120 is kept cool by action of pump 125 and chiller unit 130. In this manner, the heat generated by the devices is removed via the vaporizing of the two phase liquid, thence to the fluid in the condenser 120, and finally to the atmosphere via the chiller 130. Incidentally, in any of the disclosed embodiments, chiller 130 can be other type of cooling unit or cooling system for cooling liquid, e.g., water, circulating in the condenser 120.

As experience has shown, in operation part of the vapor escapes the enclosure 105 and is lost to the ambient atmosphere. Consequently, the two phase cooling pool 115 needs to be replenished periodically. Failing to replenish the pool may lead to unacceptable temperature rise in the servers. Moreover, each time the enclosure 105 needs to be opened, e.g., to replenish the pool 115, to service the servers 110, to add or replace servers 110, etc., a certain amount of vapor escapes the enclosure 105, and the longer the enclosure remains open the more vapor escapes, which requires further replenishment of the pool 115. However, as noted, the two phase cooling liquid is very expensive, so each time the pool needs to be replenished it adds substantial expense to the maintenance cost of the cooling system, which counters the savings gained by not requiring mechanical circulation of the cooling liquid.

The following embodiments provide a two-phase immersion system which avoids or at least minimizes the loss of vapor encountered in the prior art. The loss of vapor can be understood as the loss of the two phase coolant. The disclosed embodiments enable maintenance operations of the servers with the control of escaping vapor. As will be explained in further details below, disclosed embodiments provide an immersion cooling for electronic devices, i.e., chips, processors and electronics, generally having two sections: a cluster section wherein servers are immersed in two phase liquid inside immersion tanks, and a facilities section wherein vapor from the cluster section is condensed and stored in a resupply tank. The cooled liquid from the resupply tank is delivered to the immersion tank as needed to maintain desired level of two phase liquid. The vapor from the immersion tank is transported to the facilities section in one of two ways. During normal operation the vapor travels from the immersion tank to the condenser inside a dedicated vapor passageway; however, during maintenance of the servers, the vapor travels inside a containment passageway. In some embodiments the dedicated vapor passageway leads to a main condenser, while the containment passageway leads to an auxiliary condenser. The condensed fluid from both the main condenser and the auxiliary condenser can be stored in the same resupply tank, wherein the condensed liquid may further cool down until it is delivered to the immersion tank. Also, in some embodiments the vapor passageway is positioned within the containment passageway, such that any vapor not entering the vapor passageway is captured within the containment passageway.

Additionally, the flow of vapor is controlled by a dedicated air mover to maximize the flow of vapor towards the condenser. Various implementations are provided to adjust the operation of the air mover to ensure proper flow of the vapor.

FIG. 2 is an illustration conceptually showing the general architecture of a two-phase immersion cooling system according to an embodiment. In this approach the server enclosure 207 houses the servers 210 immersed in two phase immersion liquid 215, leaving an evaporation space 218 above the immersion liquid 215. As devices within servers 210 operate and generate heat, liquid contacting these devices evaporate and the vapor rises as shown by the dotted arrows. However, in this embodiment the enclosure 207 does not contain a condenser. Rather, the vapor is directed to a condensation facility 222 which includes the condenser 220, as representatively illustrated by the dash-dot arrow. So, while the enclosure 207 does maintain a two-phase environment (in the form of the two phase liquid 215 and vapor rising therefrom), the vapor is not condensed within the enclosure 207 but is rather transported to a condenser 220 situated external to the enclosure 207. When the vapor is condensed by condenser 220, the condensed liquid is directed to a resupply pool or tank 240, as illustrated by the solid arrow. As needed, liquid from resupply pool 240 is delivered to the immersion tank 218 by, e.g., operation of pump 245.

Thus, in disclosed embodiments, the transition from liquid to vapor occurs within the enclosure 207, but the transition from vapor to liquid occurs exterior to, and remotely from, the enclosure 207. The transition from liquid to vapor transfers heat from the processors and electronics to the vapor, which then transports the heat out of the enclosure 207. In the condenser, the transition from vapor back to liquid deposits the heat carried away from the enclosure 207 onto the coolant flowing within the condenser. The coolant flowing within the condenser then transports the heat to the dry cooler or other external cooling unit 230, which may be outside of the building and release the heat to the ambient atmospheric environment.

FIG. 3 is an illustration showing the general architecture of a two-phase immersion cooling system arranged in different sections of a server facility, according to an embodiment. A feature of this embodiment is that it employs a vapor containment enclosure 350, representatively indicated by the dash-dot rectangles. The vapor containment enclosure 350 prevents vapor from escaping beyond the area defined by containment enclosure 350 and is designed to direct vapor towards the main condenser 320, the auxiliary condenser 324, or both. The containment can be achieved by, e.g., dedicated ducting arrangement, walls sealing off the area exterior to the enclosure 307 and the condensers 320 and 324, etc. The flow of air and vapor within the containment enclosure 350 is controlled by an air mover 344, as will be described in more details below.

Once the vapor condenses it does not directly flow back to the pool 315 as in the prior art, but is rather directed into a resupply pool 340, which may also be within the containment enclosure 350. The containment enclosure 350 represents the concept of forming a dedicated path for the vapor to the dedicated locations where the condensing units are located. In disclosed embodiments the containment enclosure 350 is structured such that during normal operations vapor is condensed by the main condenser 320, but during maintenance operations escaping vapor is condensed by the auxiliary condenser 324. Also, during normal operation any escaping vapor is captured within the containment enclosure and is directed towards the auxiliary condenser 324. The escaping vapor during normal operation can be understood as the portion of the vapor which does not contained within the vapor passageway 348 to the main condenser 320.

As illustrated conceptually in FIG. 3, vapor rising from the pool 315 may travel in either vapor passageway 348 or within the containment enclosure 350. Vapor passageway 348 is the defined path for the vapor during normal operation with lid 308 close. Vapor passageway 348 direct the vapor directly to the main condenser 320. During normal operation of the servers, the vapor is delivered to the main condenser 320 via the dedicated vapor transport passageway 348, e.g., dedicated ducts. This is shown conceptually by the dash-dot arrow marked 348. However, during operations such as, e.g., service of servers 310, any vapors not transported within the dedicated vapor transport passageway 348 are contained within the containment enclosure 350 and rise towards the condenser 320 and/or auxiliary condenser 324. Pressure differential generated by the air mover 344 can be used to direct and assist the vapor to flow to the auxiliary condenser 324. Note that in this embodiment a first vapor transport mechanism, i.e., passageway 348, is contained within a second vapor transport mechanism, which is defined by the vapor containment enclosure 350.

The auxiliary condenser 324 provided above the resupply pool 340, acts to condense any vapor delivered by the containment enclosure 350, e.g., during server maintenance, into the resupply pool 340. Thus, any errant vapor that does not travel within the vapor passageway 348, would be captured within the containment enclosure 350 and condensed by the auxiliary condenser 324. Therefore, it is beneficial to generate a low-pressure area at the auxiliary condenser 324 to form an air stream (which includes air flow and vapor flow) towards and through the auxiliary condenser. This is achieved by the provision of the air mover 344, which may be, e.g., a fan, a blower, etc.

FIG. 3 also illustrates the particular placement of the various elements of the immersion system of this embodiment. Specifically, the immersion tank 307 with liquid pool 315 is positioned within the server cluster area. The cluster area is the area where all the servers are housed and operate—it's a clean and highly secured area. The condenser 320, auxiliary condenser 324, and resupply pool 340 are housed within the area of the service facilities, which is physically separated from the cluster area. For example, the service facilities area may be located above the top of the cluster area, but still within the building. Conversely, the dry cooler 330, e.g., a chiller or evaporative cooler, may be placed outside the building, e.g., on the roof of the building. The dry cooler 330 supplies cold fluid to the condenser 320 and auxiliary condenser 324. The pump 345 for providing two phase liquid from the resupply pool 340 to the pool 315 may also be placed in the facilities area.

FIG. 3 also indicates the inlet conduit 341 of the resupply tank 340, for receiving condensed liquid from the main condenser 320, and the outlet conduit 343 for delivering the condensed liquid from the resupply tank 340 to the immersion tank 315. Chiller conduits 337 exchange chiller liquid between the dry cooler and the main condenser 320 and auxiliary condenser 324. Also, in this embodiment the locations of the auxiliary condenser 324 is higher than the position of the main condenser 320, so as to better capture the vapor from within the containment enclosure 350 and potentially vapor that escaped the main condenser 320. The auxiliary condenser 324 is also positioned directly above the resupply tank 340, such that condensed liquid drips directly into the resupply tank 340. The condenser 320 includes well designed hardware to capture the condensed vapor and direct the liquid to the resupply pool 340.

In disclosed examples the operation of the air mover 344 may be controlled by controller 360. For example, the air mover 344 may be a variable speed blower and its speed may be controlled by controller 360. In one example, a lid sensor 362 sends a lid open signal to the controller 360 whenever the lid 308 is opened. This signifies to the controller that a large amount of vapor would be released, and so the controller may energize the air mover 344 to a high speed. Alternatively or additionally, signals from pressure sensors 364 and 366 may be sent to the controller 360. The controller than calculates the pressure differential between the signals of the two pressure sensors and deduce therefrom a proper speed for the air mover 344. Pressure sensor 364 may be located inside the server enclosure 307 while pressure sensor 366 may be located proximally to the auxiliary condenser 324. Also, a single pressure sensor, e.g., sensor 366 may be used to measure the pressure at the condenser and the controller may compare its reading to a set threshold and determine the proper speed of the air mover from the comparison. Another option is to use the sensor 364 to measure the pressure inside the server enclosure 307. When the lid 308 is opened, the pressure within the server enclosure 307 will drop, which would be identified by the pressure sensor 364 and reported to the controller 360. In this sense, pressure sensor 364 also serves the function of lid sensor 362, thus perhaps eliminating the need for lid sensor 362.

Figure 4:
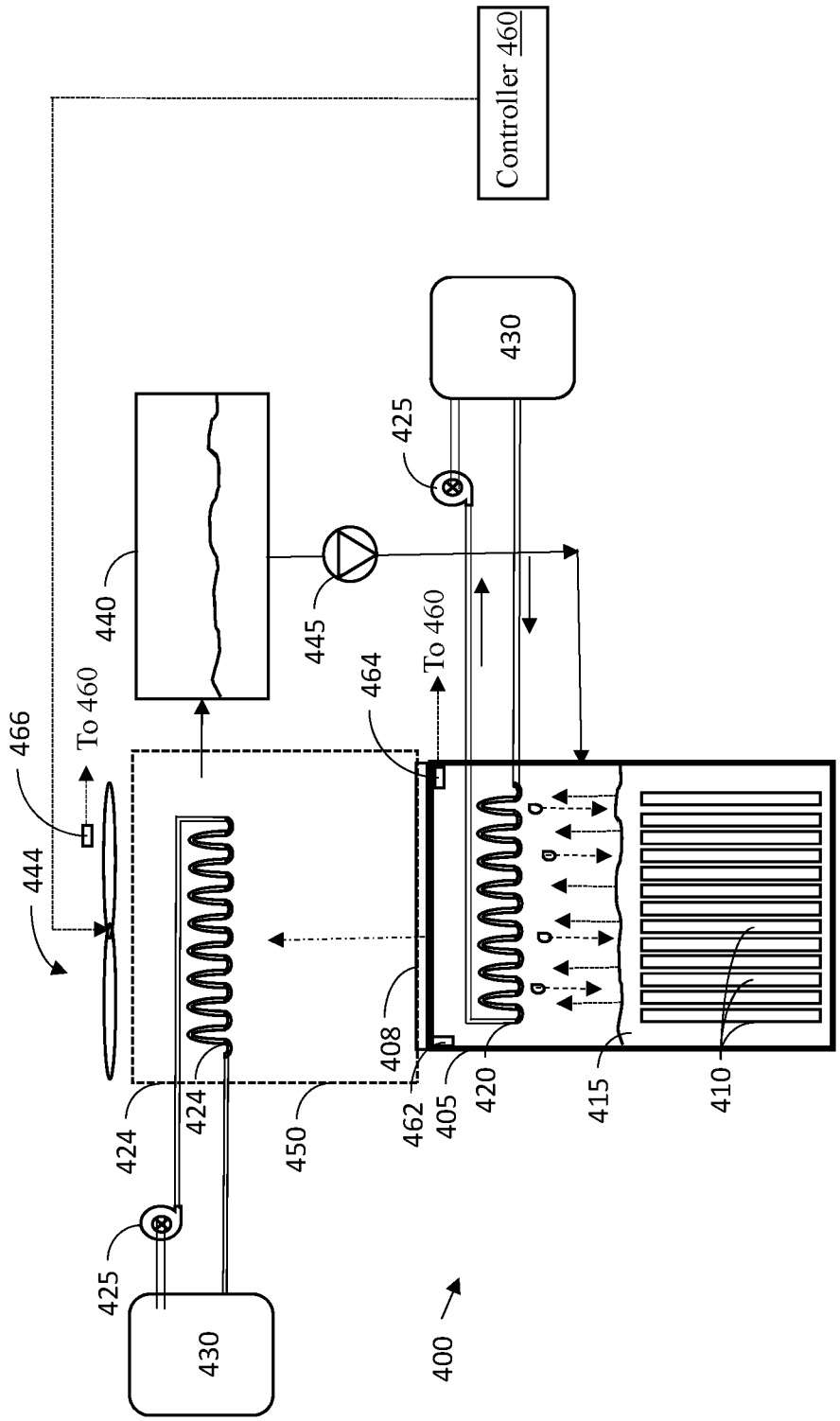
FIG. 4 illustrates another embodiment of a two-phase immersion system.

FIG. 4 illustrates an embodiment for a "hybrid" two-phase immersion cooling system employing both an internal condenser 420 situated inside the server enclosure 405, and an auxiliary condenser situated inside the containment enclosure 450. During normal operation, vapor within the server enclosure 405 condenses upon contacting the internal condenser 420 and drips into pool 415. Any vapor that escapes the server enclosure 405 flows within the containment enclosure 450 and condenses upon contacting the auxiliary condenser 424. Also, when the lid 408 is opened, escaping vapor are contained within the containment enclosure 450 and condense upon contacting the auxiliary condenser 424. The condensed liquid from the auxiliary condenser 424 is collected in the resupply tank 440 by either placing the auxiliary condenser directly above the resupply tank 440 so that the liquid drips directly into the resupply tank 440, or providing the proper conduit from the condenser 424 to the resupply tank 440. In a design wherein the auxiliary condenser is not located directly above the resupply pool 440, it requires that the condenser 424 arrangement includes built-in hardware for collecting the liquid condensed back from the vapor and directing the liquid to the resupply pool 440.

As with the embodiment of FIG. 3, the lid sensor 462 sends signal to the controller 460 when the lid 408 is opened. Since the main condenser is inside the server enclosure 405, in this embodiment the controller may be set to keep the air mover 444 in the off position until a signal is received that the lid 408 has been opened. At this point, the controller may activate the air mover 444. Also, pressure sensors 464 and 466 may supply pressure signals to the controller and the controller may send activation signal to the air mover 444 to generate a desired pressure differential to ensure proper flow to the auxiliary condenser 424. For example, the controller may determine a difference between the signals of sensors 464 and 466 and operate the air mover 444 according to the difference.

Figure 5:
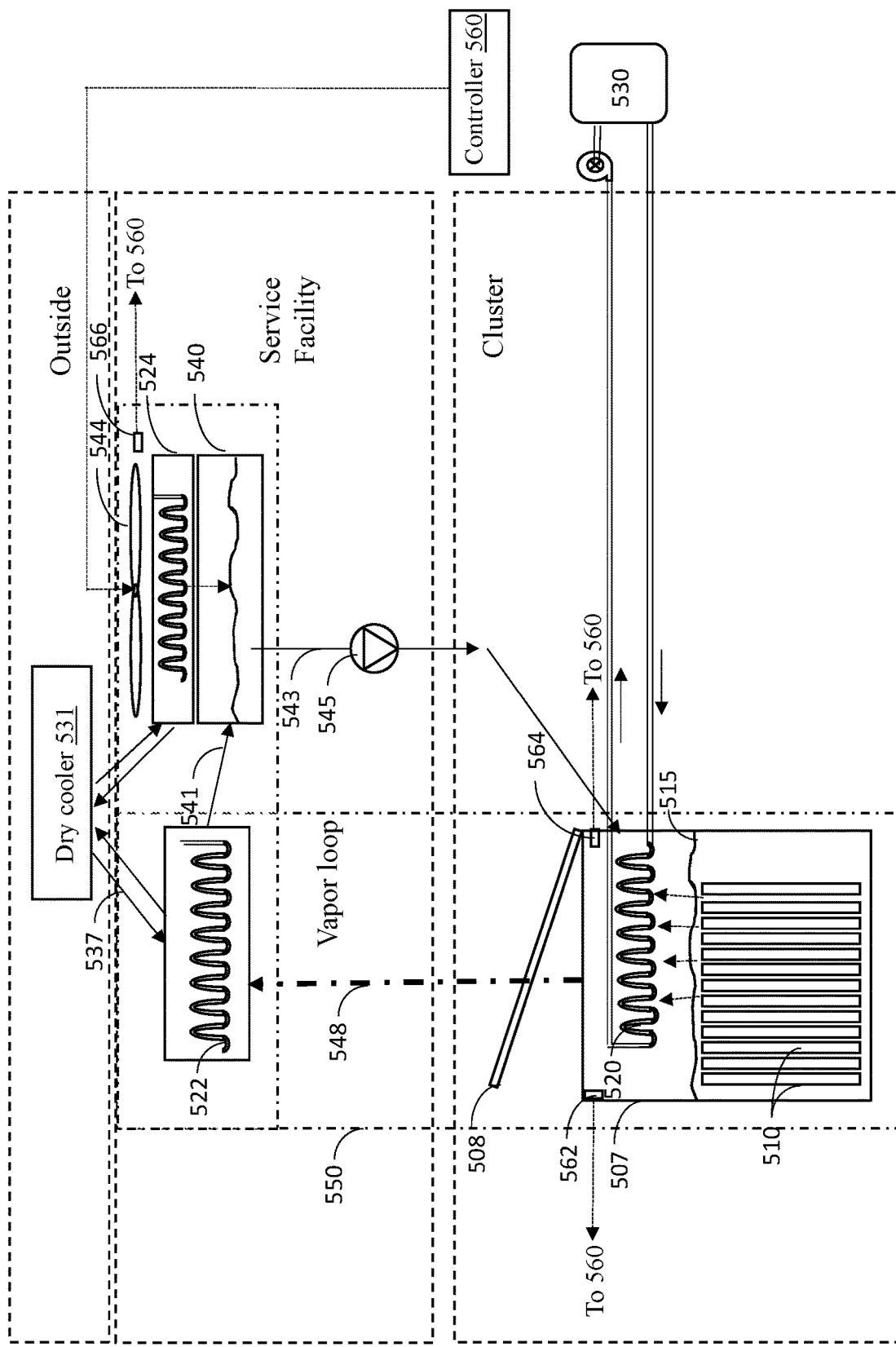
FIG. 5 illustrates yet another embodiment of a two-phase immersion system in a computing facility.

FIG. 5 illustrates an embodiment having expanded design, in that it has a main condenser 520 integrated inside the server enclosure 507, a secondary condenser 522, and an auxiliary condenser 524. The main condenser 520 operates in a conventional manner to condense vapor within the server enclosure 507. The secondary condenser 522 is positioned outside the server enclosure 507 and operates to condense vapor traveling within the vapor passageway 548, e.g., dedicated ducting. Any vapor that escapes the server enclosure 507 would be condensed by the secondary condenser 522. The auxiliary condenser 524 is positioned within the containment enclosure 550 such that when the lid 508 is opened, as illustrated in FIG. 5, escaping vapor would travel within the containment enclosure 550 and would be condensed by auxiliary condenser 524. The condensed liquid from the secondary and auxiliary condensers are stored in the resupply pool 540. The reason the design includes a main condenser 520 within the immersion tank 507 and a secondary condenser 522 on top of the tank is for redundant design consideration. In one embodiment, the main condenser 520 can be implemented in each immersion tank in a cluster (see, e.g., FIGS. 6 and 7), and the secondary condenser 522 can be shared by more than one immersion tanks.

In the embodiment of FIG. 5, one cooler 530 is shown to service the main condenser 520 and a separate cooler 531 services the secondary and auxiliary condensers. However, it should be appreciated that a single cooler can be used to service all of the condensers within the system. Also, as in previous embodiments, signals from the sensors 562, 564, 566, are sent to the controller 560, which activates the air mover 544, thereby controlling the flow of vapor towards and through the auxiliary condenser 524. The design considers a full redundant based system.

Figure 6:
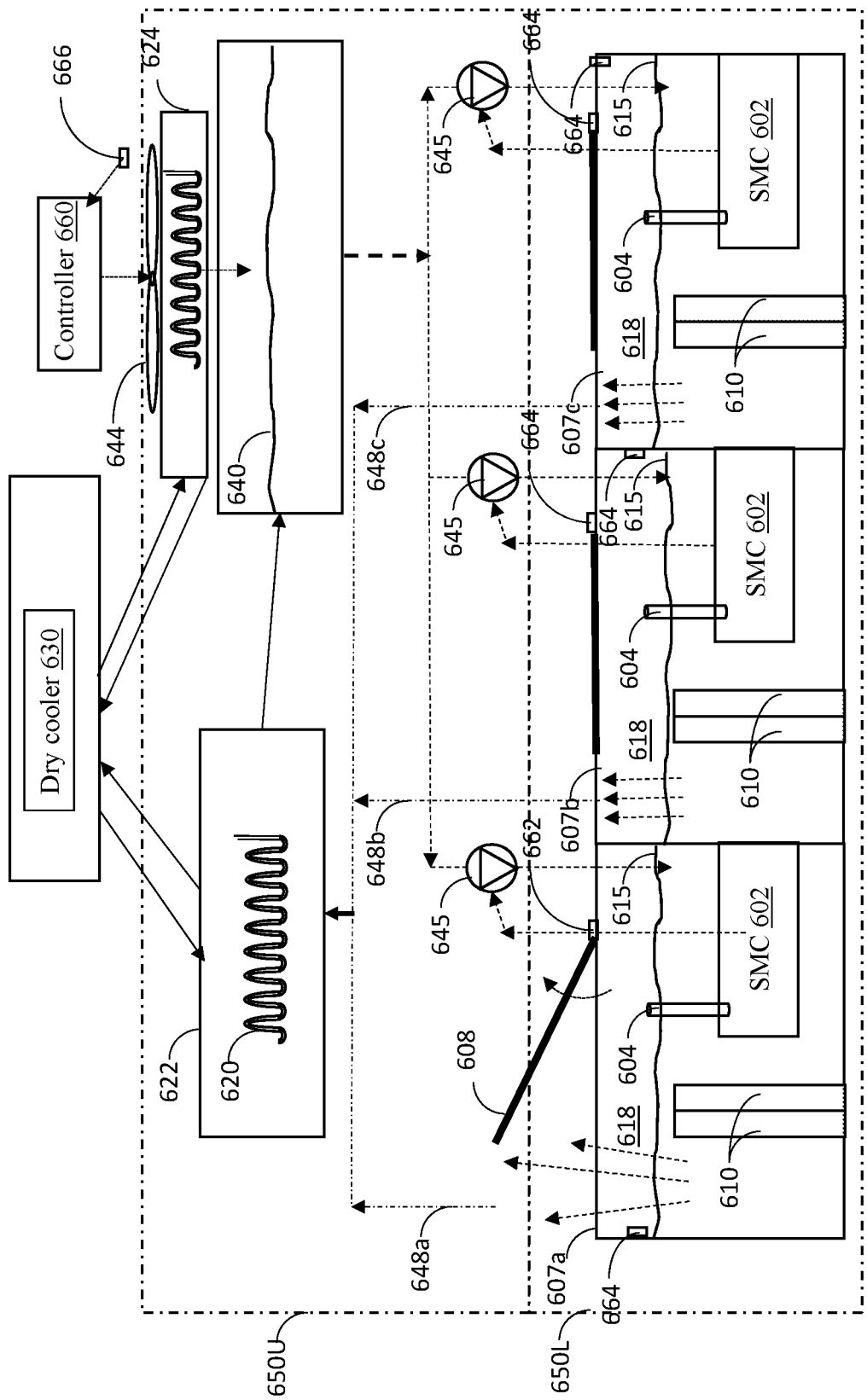
FIG. 6 illustrates an embodiment of a two-phase immersion system having multiple immersion enclosures serviced by a central vapor condenser arrangement.

FIG. 6 illustrates an embodiment of applying the innovative features disclosed herein at a cluster level design. It should be appreciated that due to the complexity of the design, many of the elements are illustrated schematically so as to convey the conceptual architecture, without obscuring the various elements of the design. For example, ducting, piping, hoses, electrical cables, etc. are simply represented by arrows to indicate general connectivity and flow, thus enhancing understanding of this architecture.

In this embodiment the containment region is delineated by a lower containment enclosure 650L, where multiple immersion systems with the servers are located, and an upper containment enclosure 650U, where the main condenser 620, the auxiliary condenser 624, and the liquid resupply units are located. The lower containment enclosure 650L and upper containment enclosure 650U are sealed to the exterior, but have fluid communication there-between, such that vapor can travel from the lower containment enclosure 650L to the upper containment enclosure 650U, but cannot escape beyond the two containment enclosures. The cluster includes several server enclosures 607a-607c, each having liquid pool 615 and a plurality of servers 610 immersed in two phase liquid in immersion tank 618.

During normal operation, the vapor from each of the liquid pools 615 travels via its dedicated passageway 648a-648c to the main condenser facility 622, as schematically illustrated by the dash-dot arrows. Once condensed into liquid, the condensed liquid is transported to a common resupply pool 640, which services multiple immersion systems. Liquid from the common resupply pool 640 is supplied to any of the liquid pools 615 via dedicated pump 645, according to signals from a system management controller, SMC 602.

Conversely, upon opening any of the enclosures 607a-607c, as illustrated by open lid 608, any escaping vapor would be contained by the lower containment enclosure 650L and be directed towards the upper containment enclosure 650U where it would be condensed by main condenser 620, auxiliary condenser 624, or both. Any errant vapor would be condensed by auxiliary condenser 624 and be delivered to the resupply pool 640. The flow of vapor towards and through the auxiliary condenser 624 is enhanced by the air mover 644 according to signals received from controller 660. As in other embodiments, controller 660 may receive signals such as open lid signal from lid position sensor 662 and/or pressure reading signals from sensors 664 and 666. The controller 660 controls the operation of the air mover 644 to generate the proper pressure differential with low pressure at the auxiliary condenser 624, such that vapor would flow towards the auxiliary condenser 624.

During either modes of operations, the SMC 602 may monitor the system's power consumption, the signal from a liquid level sensor 604, or both to control the delivery of liquid resupplied from the resupply pool 640 to each individual liquid pool 615. Notably, during service mode the system may be shut off, so that no power is supplied and the only indication for required resupply of liquid can be obtained from the liquid level sensor 604.

As indicated above, FIG. 6 illustrates the condition wherein the lid 608 of enclosure 607a is opened, e.g., for maintenance of servers 610 therein. In this condition, the vapor is not transported by the vapor passageway 648a, as illustrated conceptually by the shortened arrow 648a which does not connect to enclosure 607a. The other two enclosures 607b and 607c operate normally and vapor from these enclosures still travels via vapor passageway 648b and 648c, respectively, towards the main condenser 620. Since the connection to vapor passageway 648a has been disrupted partially, large amount of vapor escapes enclosure 607a, as illustrated by the triple diverging arrows. However, the escaping vapor is contained within the lower containment enclosure 650L and is directed towards the upper containment enclosure 650U, by the pressure differential generated by the air mover 644. The flowing vapor is condensed by either condenser 620 auxiliary condenser 624, or both, and the condensed liquid is delivered to the resupply pool 640.

In this example, controller 660 is shown to control the operation of the air mover 644, while SMC 602 controls the liquid resupply system. However, both the controller 660 and SMC 602 may be simply referred to as system management controller, which may be implemented as a single central controller or several distributed controllers.

Figure 7:
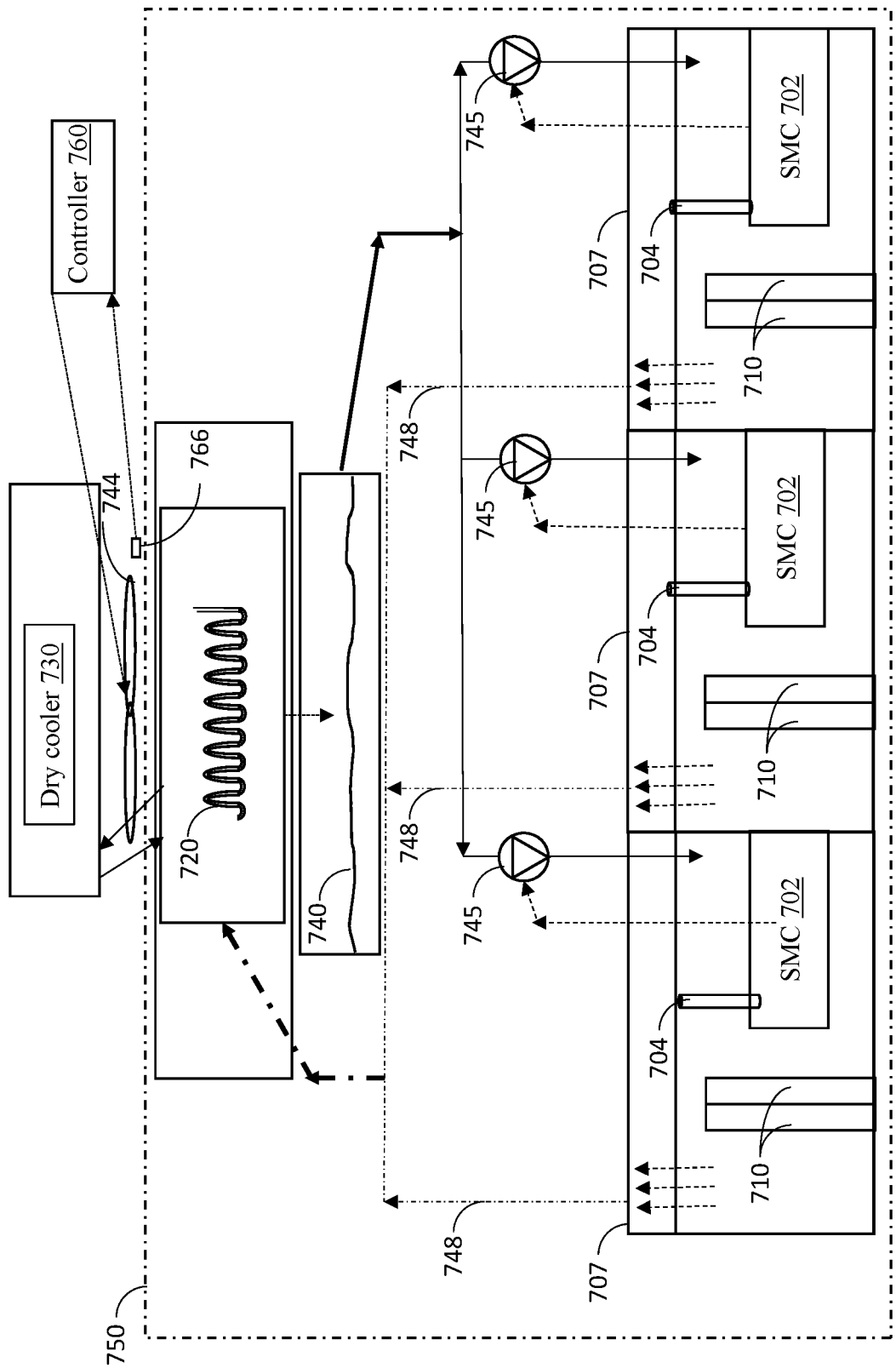
FIG. 7 illustrates another embodiment of a two-phase immersion system having multiple immersion enclosures serviced by a central vapor condenser arrangement.

FIG. 7 illustrates another embodiment of a cluster level two-phase immersion cooling system. The embodiment of FIG. 7 is very similar to that of FIG. 6, except that in FIG. 7 a single condenser 720 serves as both the main condenser and the auxiliary condenser. The single condenser 720 is positioned above the resupply pool 740, such that the condensed liquid can be dripped directly to the resupply pool 740. As illustrated, the condenser 720 condenses vapor delivered either by the dedicated vapor passageway 748 (during normal operation) or vapor that is contained by the vapor containment enclosure 750 (either during maintenance or vapor escaping from the enclosure 707 or vapor passageway 748).

As shown, disclosed embodiments provide an immersion cooling for processors and electronics wherein the transition from liquid to vapor occurs in the immersion tank, but then the vapor is transported outside of the immersion tank and the transition from vapor to liquid occurs remotely from the immersion tank. Also, following the condensation of the vapor, the condensed liquid is diverted into a resupply pool and is provided with an opportunity to cool before it is resupplied to the immersion tank. The flow of the vapor is controlled by an air mover that generates pressure differential to direct the vapor towards the condenser.

Thus, in disclosed embodiments the immersion cooling system includes a processing section having at least one immersion tank with servers immersed in two phase liquid inside the immersion tank, and a vapor transport mechanism that includes an air mover transporting vapor from the immersion tank to a recirculation section wherein vapor from the processing section is condensed by a condenser, and the condensed liquid is delivered to a resupply tank. A liquid delivery arrangement is provided to deliver condensed liquid from the resupply tank to the immersion tank. A system management controller may control the delivery of liquid from the resupply liquid tank to the immersion tank as needed to maintain desired level of two phase liquid. The system management controller may also control the operation of the air mover to generate the required pressure differential to efficiently direct the vapor towards the condenser.

As noted, the vapor from the immersion tank is transported to the recirculation section in one of two ways. During normal operation the vapor travels from the immersion tank to the condenser inside a dedicated vapor passageway. Conversely, during maintenance of the servers in the immersion tank the vapor travels inside a containment passageway. In some embodiments the dedicated vapor passageway leads to a main condenser, while the containment passageway leads to an auxiliary condenser. The condensed fluid from both the main condenser and the auxiliary condenser can be stored in the same resupply tank.

According to disclosed aspects, an immersion cooling system for cooling servers is provided, comprising: an immersion enclosure having immersion tank configured for immersing a plurality of servers in two phase liquid; a condenser arrangement situated remotely from the immersion enclosure; a vapor passageway configured for transporting vapor from the immersion enclosure to the condenser arrangement; an air mover fluidly connected to the vapor passageway and configured to generate pressure differential to direct vapor towards the condenser arrangement; and a resupply tank having inlet conduit for receiving condensed liquid from the condenser arrangement and outlet conduit for delivering the condensed liquid to the immersion tank.

According to further disclosed aspects, a method is provided for cooling processors and electronics using two phase liquid immersion, comprising: providing an immersion tank with two phase liquid and immersing the processors and electronics in the two phase liquid; applying power to the processors and electronics to operate the chips; removing vapor emanating from the immersion tank and activating an air mover to direct the vapor to a condenser; collecting condensed liquid from the condenser and delivering the condensed fluid to a resupply tank; and, monitoring the level of the two phase liquid and when necessary adding liquid to the immersion tank from the resupply tank.

In yet further aspects, a computing facility is disclosed, comprising: a cluster section having a plurality of immersion tanks positioned therein, each of the plurality of immersion tanks having a plurality of computing boards immersed in two phase liquid within the immersion tank; a facilities section having a condenser arrangement and a resupply tank positioned therein; a plurality of vapor passageways, each providing fluid communication between a respective immersion tank and the condenser arrangement; a containment passageway enclosing the plurality of immersion tanks, the condenser arrangement and the plurality of vapor passageways, the containment passageway providing fluid communication between the plurality of immersion tanks and the condenser arrangement and containing flow of vapor from the plurality of immersion tanks from flowing outside of the containment passageway; and an air mover fluidly connected to the containment passageway and configured to generate pressure differential within the containment passageway to thereby direct vapor towards the condenser arrangement.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An immersion cooling system for cooling servers, comprising:
    an immersion enclosure having:
        an immersion tank configured for immersing a plurality of servers in a liquid phase of a two phase fluid, and
        a lid configured to close the immersion tank;
    a condenser arrangement situated remotely from the immersion enclosure;
    a containment passageway configured for containing a vapor phase of the two phase fluid emanating from the immersion tank when the lid is open from the immersion tank;
    an air mover fluidly coupled to the containment passageway and configured to generate pressure differential within the containment passageway to thereby direct the vapor phase towards the condenser arrangement; and,
    a resupply tank having an inlet conduit for receiving the condensed liquid phase from the condenser arrangement and an outlet conduit for delivering the condensed liquid phase to the immersion tank.

2. The cooling system of claim 1, further comprising:
    a lid position sensor providing a signal indicative of position of the lid of the immersion enclosure; and,
    a controller receiving the signal from the lid position sensor and controlling operation of the air mover accordingly.

3. The cooling system of claim 2, further comprising at least one pressure sensor providing at least one pressure signal to the controller.

4. The cooling system of claim 2, further comprising at least two pressure sensors providing pressure signals to the controller and wherein the controller determines a difference between the pressure signals and operates the air mover according to the difference.

5. The cooling system of claim 1, wherein the condenser arrangement comprises a main condenser and an auxiliary condenser, and wherein a vapor passageway is fluidly connected between the immersion tank and the main condenser and the containment passageway is fluidly connected between the immersion tank and the auxiliary condenser.

6. The cooling system of claim 5, wherein the auxiliary condenser is positioned directly above the resupply tank, such that the condensed liquid phase drops directly into the resupply tank.

7. The cooling system of claim 5, wherein the main condenser and the auxiliary condenser are coupled to an external cooler.

8. The cooling system of claim 7, further comprising a controller controlling operation of a pump to deliver liquid from the resupply tank to the immersion tank.

9. The cooling system of claim 8, further comprising a fluid level sensor identifying immersion liquid level indication to the controller.

10. The cooling system of claim 1, wherein the air mover comprises a fan or a blower packaged together with an auxiliary condenser of the condenser arrangement.

11. A method for cooling electronic devices using air mover to generate pressure differential in a two phase fluid immersion system, comprising:
provided an immersion tank with a two phase fluid and immersing the electronic devices in at least partially in a liquid phase of the two phase fluid;
providing a lid openable to permit maintenance of the electronic devices in the immersion tank;
applying power to operate the electronic devices;
capturing a vapor phase of the two phase fluid emanating from the immersion tank and directing a vapor to flow within a containment passageway when the lid is open permitting the maintenance of the electronic devices in the immersion tank;
activating the air mover to force the vapor phase within the containment passageway to flow towards a condenser; and,
collecting the condensed liquid phase from the condenser and delivering the condensed liquid phase to a resupply tank.

12. The method of claim 11, wherein directing the vapor to the condenser comprises during normal operation of the electronic device transporting the vapor inside a vapor passageway and during maintenance of the electronic device activating the air mover to transport the vapor inside the containment passageway.

13. The method of claim 12, wherein activating the air mover comprises receiving pressure signals from pressure sensors and determining an operational speed of the air mover according to the pressure signals.

14. The method of claim 12, wherein directing the vapor phase to the condenser comprises a first operation of transporting the vapor phase to a main condenser when the lid closed on the immersion tank and a second operation of transporting the vapor phase to an auxiliary condenser when the lid is open.

15. A computing facility, comprising:
a cluster section having a plurality of immersion tanks positioned therein, each of the plurality of immersion tanks having a plurality of computing boards immersed at least partially in a liquid phase of a two phase fluid within the respective one of the immersion tanks, each of the immersion tanks having a lid;
a facilities section having a condenser arrangement and a resupply tank positioned therein;
a plurality of vapor passageways, each providing fluid communication between the respective one of the immersion tanks and the condenser arrangement when the lid is closed on the respective one of the immersion tanks;
a containment passageway enclosing the plurality of immersion tanks, the condenser arrangement and the plurality of vapor passageways, the containment passageway providing fluid communication between the plurality of immersion tanks and the condenser arrangement and containing a flow of a vapor phase of the two phase fluid from the plurality of immersion tanks from flowing outside of the containment passageway when any lid is open from any of the immersion tanks; and,
an air mover fluidly connected to the containment passageway and generating a pressure differential within the containment passageway to thereby directing the flow of the vapor phase within the containment passageway.

16. The computing facility of claim 15, wherein the condenser arrangement comprises a main condenser and an auxiliary condenser, and wherein the air mover is positioned to generate low pressure region at the auxiliary condenser.

17. The computing facility of claim 16, further comprising at least one pressure sensor and a controller activating the air mover according to signals received from the at least one pressure sensor.

18. The computing facility of claim 17, further comprising lid position sensor providing lid open signal to the controller.

19. The computing facility of claim 17, wherein the at least one pressure sensor comprises a corresponding one of the at least one pressure sensor positioned within each of the immersion tanks.

20. The computing facility of claim 19, wherein the at least one pressure sensor further comprises one of the at least one pressure sensor positioned next to the auxiliary condenser.

* * * * *